US010768237B2

(12) United States Patent
Chou et al.

(10) Patent No.: US 10,768,237 B2
(45) Date of Patent: Sep. 8, 2020

(54) MOTOR DRIVING DEVICE AND MEASURING METHOD

(71) Applicant: FANUC CORPORATION, Yamanashi (JP)

(72) Inventors: Norihiro Chou, Yamanashi-ken (JP); Youichirou Ooi, Yamanashi-ken (JP)

(73) Assignee: FANUC CORPORATION, Yamanashi (JP)

( * ) Notice: Subject to any disclaimer, the term of this patent is extended or adjusted under 35 U.S.C. 154(b) by 107 days.

(21) Appl. No.: 16/200,786

(22) Filed: Nov. 27, 2018

(65) Prior Publication Data

US 2019/0162789 A1    May 30, 2019

(30) Foreign Application Priority Data

Nov. 28, 2017 (JP) .................................. 2017-227489

(51) Int. Cl.
*H02P 5/74* (2006.01)
*G01R 31/34* (2020.01)
(Continued)

(52) U.S. Cl.
CPC .......... *G01R 31/346* (2013.01); *G01R 27/18* (2013.01); *G01R 31/14* (2013.01); *H02P 5/74* (2013.01)

(58) Field of Classification Search
CPC ...... G01R 31/346; G01R 27/18; G01R 31/14; H02P 5/74
(Continued)

(56) References Cited

U.S. PATENT DOCUMENTS 4,562,390 A    12/1985 Tobise
7,898,264 B2 *  3/2011 Horikoshi .......... G01R 31/1263
                                                 324/547
(Continued)

FOREIGN PATENT DOCUMENTS

CN    101165505 A    4/2008
CN    103746630 A    4/2014
(Continued)

OTHER PUBLICATIONS

Untranslated Decision to Grant a Patent mailed by Japan Patent Office (JPO) for Application No. 2017-227489, Sep. 10, 2019, 3 pgs.
(Continued)

*Primary Examiner* — Jorge L Carrasquillo
(74) *Attorney, Agent, or Firm* — Fredrikson & Byron, P.A.

(57) ABSTRACT

A motor driving device includes: a converter unit having a capacitor; a plurality of inverter units having a plurality of semiconductor switching elements and configured to convert a capacitor voltage across the capacitor into an AC voltage to drive a plurality of motors; a second switch configured to connect the negative-side terminal of the capacitor to ground; a first detector configured to detect a ground-referenced voltage; and a second detector configured to detect the capacitor voltage. The motor driving device controls the semiconductor switching elements to establish a measurement state for enabling measuring of the insulation resistance of a measurement target motor, estimates a convergence value of the ground-referenced voltage based on multiple measurements of the ground-referenced voltage detected by the first detector, and then calculates the insulation resistance based on the estimated convergence value and the capacitor voltage.

8 Claims, 8 Drawing Sheets

(51) Int. Cl.
*G01R 31/14* (2006.01)
*G01R 27/18* (2006.01)

(58) Field of Classification Search
USPC .......................................................... 318/104
See application file for complete search history.

(56) References Cited

U.S. PATENT DOCUMENTS

| | | | |
|---|---|---|---|
| 8,022,658 B2* | 9/2011 | Ide | G01R 31/1227 318/802 |
| 2007/0176604 A1 | 8/2007 | Morimoto | |
| 2015/0194922 A1* | 7/2015 | Sato | G01R 31/14 318/504 |
| 2015/0256116 A1* | 9/2015 | Tateda | G01R 31/346 318/504 |
| 2016/0377670 A1* | 12/2016 | Tamida | G01R 31/12 324/551 |
| 2018/0091083 A1* | 3/2018 | Satou | G01R 27/08 |

FOREIGN PATENT DOCUMENTS

| | | |
|---|---|---|
| CN | 104767464 A | 7/2015 |
| CN | 2017184327 A | 10/2017 |
| JP | 6078359 A | 5/1985 |
| JP | 6263868 A | 3/1987 |
| JP | 10221396 A | 8/1998 |
| JP | 2007198995 A | 8/2007 |
| JP | 201481267 A | 5/2014 |
| JP | 2015169479 A | 9/2015 |
| JP | 2017142269 A | 8/2017 |
| JP | 2017173263 A | 9/2017 |
| WO | 2015076075 A1 | 3/2017 |

OTHER PUBLICATIONS

English Machine Translation of Decision to Grant a Patent mailed by Japan Patent Office (JPO) for Application No. 2017-227489, Sep. 10, 2019, 2 pgs.
Untranslated Notice of Reasons for Refusal mailed by Japan Patent Office (JPO) for Application No. 2017-227489, dated Jul. 2, 2019, 5 pgs.
English Machine Translation of Notice of Reasons for Refusal mailed by Japan Patent Office (JPO) for Application No. 2017-227489, dated Jul. 2, 2019, 5 pgs.
English Abstract and Machine Translation for Japanese Publication No. 2014-081267 A, published May 8, 2014, 31 pgs.
English Abstract and Machine Translation for Japanese Publication No. 2017-173263 A, published Sep. 28, 2017, 23 pgs.
English Abstract for Japanese Publication No. 2015-169479 A, published Sep. 28, 2015, 2 pgs.
English Abstract for Japanese Publication No. JPWO2015/076075 A1, published Mar. 16, 2017, 1 pg.
English Abstract and Machine Translation for Japanese Publication No. 62-063868 A, published Mar. 20, 1987, 6 pgs.
English Abstract and Machine Translation for Japanese Publication No. 10-221396 A, published Aug. 21, 1998, 7 pgs.
English Abstract for Japanese Publication No. 2007-198995 A, published Aug. 9, 2007, 2 pgs.
English Abstract for Japanese Publication No. 60-78359 A, published May 4, 1985, 1 pg.
English Abstract for Japanese Publication No. JP2017-142269 A, published Aug. 17, 2017, 2 pages.
English Machine Translation for Chinese Publication No. CN 101165505 A, published Apr. 23, 2008, 10 pages.
English Machine Translation for Chinese Publication No. CN 103746630 A, published Apr. 23, 2014, 20 pages.
English Machine Translation for Chinese Publication No. CN 104767464 A, published Jul. 8, 2015, 25 pages.
English Machine Translation for Japanese Publication No. JP 2017184327 A, published Oct. 5, 2017, 7 pages.

* cited by examiner

MOTOR DRIVING DEVICE AND MEASURING METHOD

CROSS-REFERENCE TO RELATED APPLICATION

This application is based upon and claims the benefit of priority from Japanese Patent Application No. 2017-227489 filed on Nov. 28, 2017, the contents of which are incorporated herein by reference.

BACKGROUND OF THE INVENTION

Field of the Invention

The present invention relates to a motor driving device and a measuring method for driving a plurality of motors and measuring insulation resistance of a plurality of motors.

Description of the Related Art

Japanese Laid-Open Patent Publication No. 2015-169479 discloses a motor driving device capable of measuring the insulation resistance of motors without being affected by leakage current flowing through semiconductor switching elements of inverter units.

SUMMARY OF THE INVENTION

In order to measure the insulation resistance (parasitic resistance) of the motor, it is necessary to wait for the current flowing through the insulation resistance to converge. Since the waiting time required for convergence varies depending on the magnitude of the parasitic capacitance of the motor, etc., the waiting time is set to a predetermined duration which is sufficiently long. Consequently, there is a problem that it takes time to measure insulation resistance.

It is therefore an object of the present invention to provide a motor driving device and a measuring method that shorten the time required for measuring the insulation resistance of motors.

According to a first aspect of the present invention, a motor driving device for driving a plurality of motors, includes: a rectifier circuit configured to rectify an AC voltage supplied from an AC power supply via a first switch to thereby obtain a DC voltage; a capacitor configured to smooth the DC voltage obtained by the rectifier circuit; a plurality of inverter units each including upper arm semiconductor switching elements configured to connect a positive-side terminal of the capacitor with motor coils of a corresponding one of the motors, and lower arm semiconductor switching elements configured to connect a negative-side terminal of the capacitor with the motor coils, the inverter units being configured to drive the multiple motors by converting a capacitor voltage across the capacitor into an AC voltage by switching operation of the upper arm semiconductor switching elements and the lower arm semiconductor switching elements; a second switch configured to connect one terminal of the positive-side terminal and the negative-side terminal of the capacitor to ground; a first detector configured to detect a ground-referenced current flowing between the one terminal of the capacitor and the ground, or a ground-referenced voltage between the one terminal of the capacitor and the ground; a second detector configured to detect the capacitor voltage across the capacitor; a switch control unit configured to establish a measurement state for enabling measurement of an insulation resistance of a measurement target motor of the motors by turning off the upper arm semiconductor switching elements and the lower arm semiconductor switching elements of all the multiple inverter units to thereby stop operation of every motor while turning off the first switch and turning on the second switch, then turning on a semiconductor switching element that is connected to another terminal of the capacitor, among the upper arm and lower arm semiconductor switching elements to which the motor coils of the measurement target motor are connected, and turning on a semiconductor switching element that is connected to the one terminal of the capacitor, among the upper arm and lower arm semiconductor switching elements to which the motor coils of each of the motors other than the measurement target motor are connected; a convergence value estimator configured to estimate a convergence value of the ground-referenced current or the ground-referenced voltage, based on multiple measurements of the ground-referenced current or the ground-referenced voltage, detected by the first detector at different detection times from one another in the measurement state; and an insulation resistance calculator configured to calculate the insulation resistance of the measurement target motor, based on the convergence value and the capacitor voltage.

A second aspect of the present invention resides in a measuring method by which a motor driving device for driving a plurality of motors measures an insulation resistance of the motor, wherein the motor driving device includes: a rectifier circuit configured to rectify an AC voltage supplied from an AC power supply via a first switch to thereby obtain a DC voltage; a capacitor configured to smooth the DC voltage obtained by the rectifier circuit; a plurality of inverter units each including upper arm semiconductor switching elements configured to connect a positive-side terminal of the capacitor with motor coils of a corresponding one of the motors, and lower arm semiconductor switching elements configured to connect a negative-side terminal of the capacitor with the motor coils, the inverter units being configured to drive the motors by converting a capacitor voltage across the capacitor into an AC voltage by switching operation of the upper arm semiconductor switching elements and the lower arm semiconductor switching elements; a second switch configured to connect one terminal of the positive-side terminal and the negative-side terminal of the capacitor to ground; a first detector configured to detect a ground-referenced current flowing between the one terminal of the capacitor and the ground, or a ground-referenced voltage between the one terminal of the capacitor and the ground; and a second detector configured to detect the capacitor voltage across the capacitor, and the measuring method includes: a switch control step of establishing a measurement state for enabling measurement of the insulation resistance of a measurement target motor of the motors by turning off the upper arm semiconductor switching elements and the lower arm semiconductor switching elements of all the multiple inverter units to thereby stop operation of every motor while turning off the first switch and turning on the second switch, then turning on a semiconductor switching element that is connected to another terminal of the capacitor, among the upper arm and lower arm semiconductor switching elements to which the motor coils of the measurement target motor are connected, and turning on a semiconductor switching element that is connected to the one terminal of the capacitor, among the upper arm and lower arm semiconductor switching elements to which the motor coils of each of the motors other than the measurement target motor are connected; a convergence value estimating step of estimating a convergence value of the ground-referenced current or the ground-referenced voltage, based on multiple measurements of the ground-referenced current, or the ground-referenced voltage, detected by the first detector at different detection times from one another in the measurement state; and an insulation resistance calculating step of calculating the insulation resistance of the measurement target motor, based on the convergence value and the capacitor voltage.

According to the present invention, it is possible to shorten the time required for measuring the insulation resistance of the motors.

The above and other objects, features, and advantages of the present invention will become more apparent from the following description when taken in conjunction with the accompanying drawings in which a preferred embodiment of the present invention is shown by way of illustrative example.

DESCRIPTION OF THE PREFERRED EMBODIMENTS

A motor driving device and a measuring method according to the present invention will be detailed below by describing preferred embodiments with reference to the accompanying drawings.

Embodiment

<Overall Configuration of Motor Driving Device 10>

Figure 1:
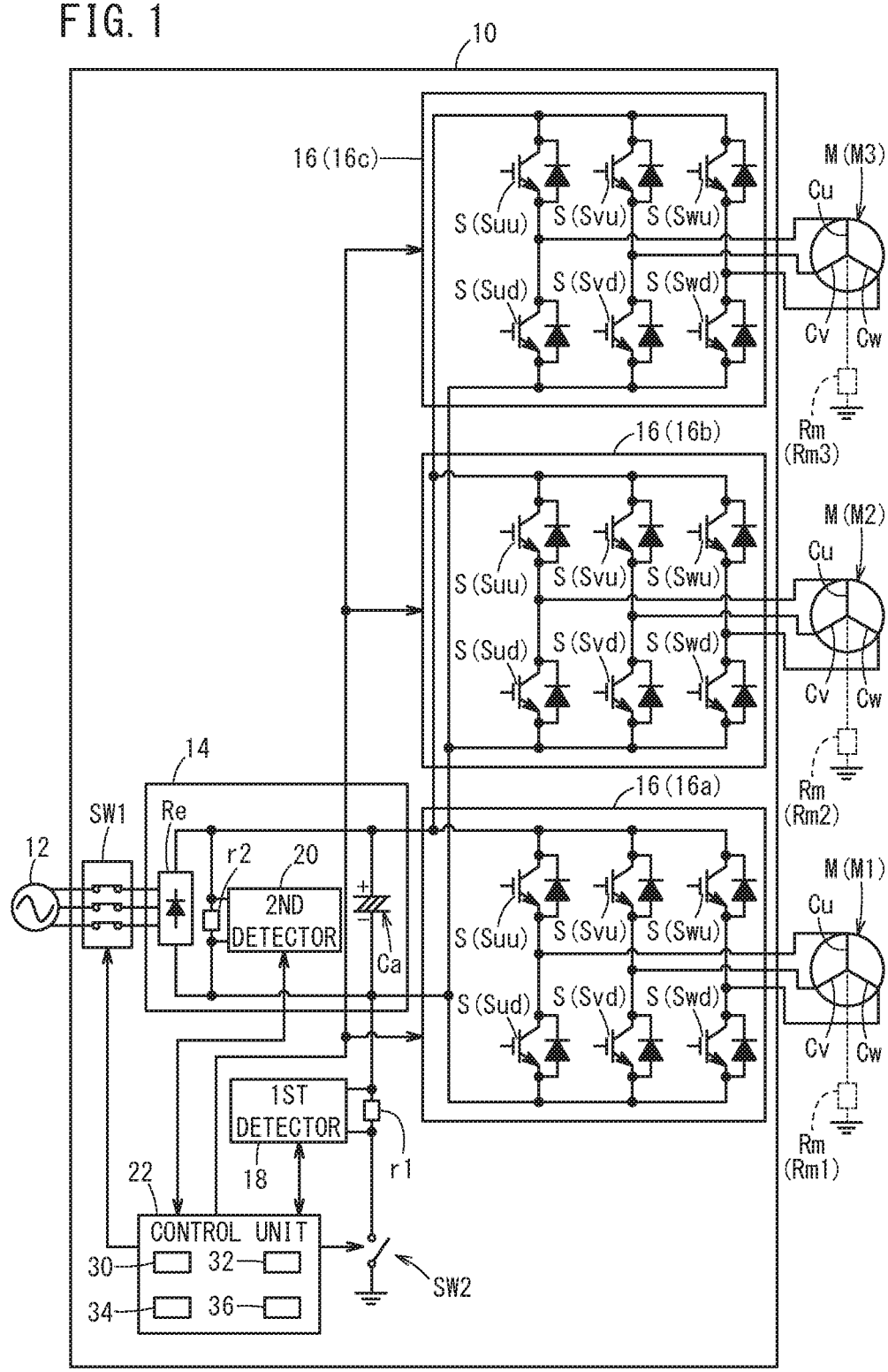
FIG. 1 is a diagram showing a configuration of a motor driving device according to an embodiment.

FIG. 1 is a diagram showing a configuration of a motor driving device 10 according to the embodiment. The motor driving device 10 drives a plurality of motors M. The motor driving device 10 includes a first switch SW1, a converter unit 14, a plurality of inverter units 16, a second switch SW2, a first detector 18, a second detector 20 and a control unit 22.

The first switch SW1 is a switch for turning on/off the supply of AC (alternating-current) voltage from an AC power supply 12.

The converter unit 14 converts the AC voltage supplied from the AC power supply 12 via the first switch SW1 into a DC (direct-current) voltage. The converter unit 14 includes a rectifier circuit Re for rectifying the AC voltage supplied from the AC power supply 12 through the first switch SW1 into a DC voltage, and a capacitor Ca for smoothing the DC voltage rectified by the rectifier circuit Re.

The multiple inverter units 16 convert the DC voltage (specifically, the voltage across the capacitor Ca) Vc converted by the converter unit 14 into AC voltage to thereby drive the multiple motors M.

In the present embodiment, in order to simplify the description, it is assumed that three motors M are provided, and the motor driving device 10 includes three inverter units 16 for driving the three motors M. In order to distinguish the three inverter units 16 from each other, the three inverter units 16 may be referred to as 16a, 16b, 16c, respectively. Further, there are cases where the motor M driven by the inverter unit 16a is denoted by M1, the motor M driven by the inverter unit 16b is denoted by M2, and the motor M driven by the inverter unit 16c is denoted by M3.

The resistance between the motor coils Cu, Cv and Cw of three phases (U, V, W) in each of the three motors M (M1 to M3) and the ground is called an insulation resistance (parasitic resistance) Rm. In order to distinguish these three insulation resistances Rm from each other, the insulation resistance Rm between the motor coils Cu, Cv, Cw of the motor M1 and the ground may be referred to as Rm1, the insulation resistance Rm between the motor coils Cu, Cv, Cw of the motor M2 and the ground may be referred to as Rm2, and the insulation resistance Rm between the motor coils Cu, Cv, Cw of the motor M3 and the ground may be referred to as Rm3.

Since the three inverter units 16 (16a, 16b, 16c) have the same configuration, only the configuration of the inverter unit 16a will be described. The inverter unit 16a has a plurality of semiconductor switching elements S. In the present embodiment, since the motor M used has three-phase (U, V, W) motor coils Cu, Cv, Cw, the multiple semiconductor switching elements S include an upper arm semiconductor switching element Suu and a lower arm semiconductor switching element Sud for the U-phase, an upper arm semiconductor switching element Svu and a lower arm semiconductor switching element Svd for the V-phase, and an upper arm semiconductor switching element Swu and a lower arm semiconductor switching element Swd for the W-phase.

The three-phase upper arm semiconductor switching elements Suu, Svu, Swu connect the positive terminal of the capacitor Ca with three-phase (U, V, W) motor coils Cu, Cv, Cw of the motor M1, respectively. The three-phase lower arm semiconductor switching elements Sud, Svd, Swd connect the negative terminal of the capacitor Ca with the three-phase motor coils Cu, Cv, Cw of the motor M1, respectively.

For each phase, the upper arm semiconductor switching element S and the lower arm semiconductor switching element S are connected in series, and the series of the upper arm semiconductor switching element S and the lower arm semiconductor switching element S, is connected in parallel to the capacitor Ca. Specifically, the series of U-phase semiconductor switching elements Suu and Sud is connected in parallel to the capacitor Ca. Similarly, the series of V-phase semiconductor switching elements Svu and Svd is connected in parallel to the capacitor Ca, and the series of W-phase semiconductor switching elements Swu and Swd is connected in parallel to the capacitor Ca.

The U-phase motor coil Cu of the motor M1 is connected to the emitter of the upper arm semiconductor switching element Suu and the collector of the lower arm semiconductor switching element Sud. The V-phase motor coil Cv of the motor M1 is connected to the emitter of the upper arm semiconductor switching element Svu and the collector of the lower arm semiconductor switching element Svd. The W-phase motor coil Cw of the motor M1 is connected to the emitter of the upper arm semiconductor switching element Swu and the collector of the lower arm semiconductor switching element Swd.

The inverter unit 16a performs switching operation (ON/OFF operation) on the three-phase upper arm semiconductor switching elements Suu, Svu, Swu and the three-phase lower arm semiconductor switching elements Sud, Svd, Swd to convert the voltage across the capacitor Ca (which will be referred to as the capacitor voltage Vc) into AC voltage to thereby drive the motor M1.

The second switch SW2 is a switch for connecting one terminal of the capacitor Ca (which is the terminal on the negative electrode side of the capacitor Ca in the present embodiment and will be referred as the first terminal) to the ground, in order to measure the insulation resistance Rm (Rm1, Rm2, Rm3).

The first detector 18 is a sensor for detecting the voltage (hereinafter referred to as the ground-referenced voltage Vm) between the first terminal of the capacitor Ca and the ground when the second switch SW2 is ON. A detection resistor r1 is connected in series with the second switch SW2 between the first terminal (the terminal on the negative electrode side) of the capacitor Ca and the ground. The first detector 18 detects the ground-referenced voltage Vm by measuring the voltage Vm across the detection resistor r1. Since the resistance value of the detection resistor r1 is known, the first detector 18 may detect the current flowing between the first terminal of the capacitor Ca and the ground (hereinafter referred to as the ground-referenced current Im) from the detected ground-referenced voltage Vm).

The second detector 20 is a sensor for detecting the capacitor voltage Vc between both terminals of the capacitor Ca. A detection resistor r2 is connected in parallel with the capacitor Ca. The second detector 20 detects the capacitor voltage Vc by measuring the voltage across the detection resistor r2.

The control unit 22 controls various components (the first switch SW1, the second switch SW2, the multiple semiconductor switching elements S, etc.) of the motor driving device 10 to drive the motors M (M1 to M3) and the like, and measures the insulation resistance Rm of motors M. The control unit 22 is made up of a processor such as a CPU, memory and others.

The control unit 22 selects one of the three motors M (M1 to M3) as a measurement target and measures the insulation resistance Rm of the selected motor M to be measured, i.e., the measurement target. Therefore, by switching to a motor M selected as the measurement target from among the motors M, it is possible to measure the insulation resistance Rm (Rm1 to Rm3) of all the motors M (M1 to M3).

The control unit 22 includes a measurement target selector 30, a switch control unit 32, a convergence value estimator 34, and an insulation resistance calculator 36.

The measurement target selector 30 selects one motor M as a measurement target. The motor M to be measured may be selected at random or based on a predetermined order. The measurement target selector 30 outputs information indicative of the motor M selected as the measurement target, to the switch control unit 32.

The switch control unit 32 performs on/off control of each of the first switch SW1, the second switch SW2 and the multiple semiconductor switching elements S. In measuring the insulation resistance Rm, the switch control unit 32 controls each of the first switch SW1, the second switch SW2 and the multiple semiconductor switching elements S so as to set up a measurement state for enabling measurement of the insulation resistance Rm of the motor M selected as the measurement target.

First, the switch control unit 32 turns off all the multiple semiconductor switching elements S (Suu, Svu, Swu, Sud, Svd, Swd) of each of the three inverter units 16 (16a to 16c), to thereby stop the operation of all the motors M (M1 to M3).

Then, the switch control unit 32 turns off the first switch SW1 and turns on the second switch SW2. Thus, the AC voltage from the AC power supply 12 is not supplied to the motor driving device 10 while the first terminal of the capacitor Ca (in this embodiment, the terminal on the negative electrode side of the capacitor Ca) is connected to the ground. As a result, the motor driving device 10 enters a measurement preparation state.

Figure 2:
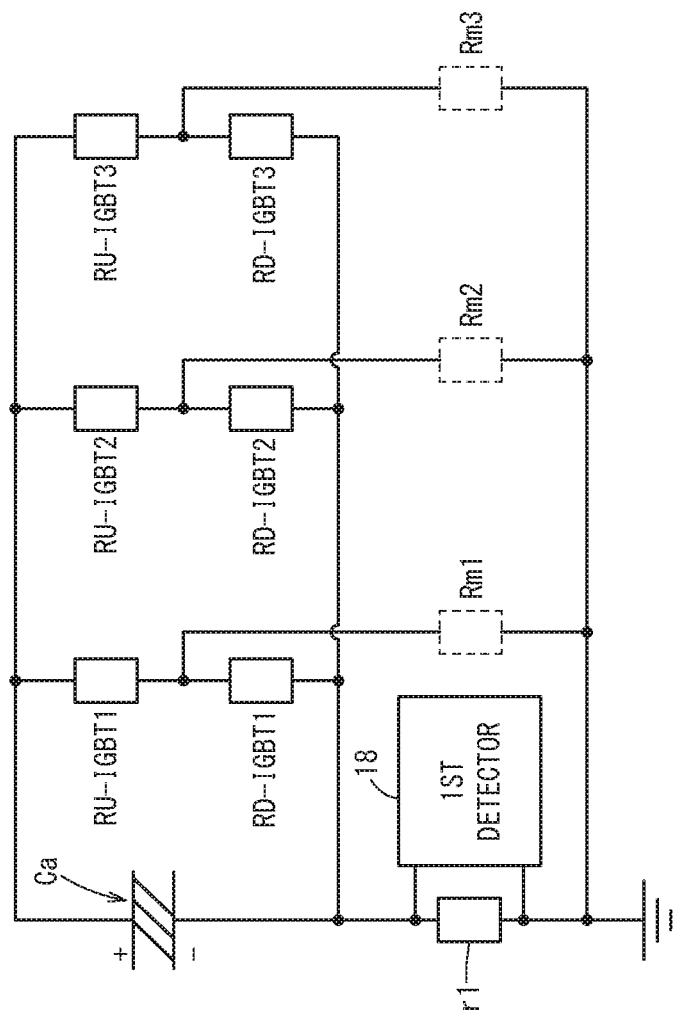
FIG. 2 is an equivalent circuit diagram showing, by using an equivalent circuit, the connection of the insulation resistance of motors when the motor driving device is in a measurement preparation state.

FIG. 2 is an equivalent circuit diagram of a state where the motor driving device 10 is set in the measurement preparation state (that is, all the multiple semiconductor switching elements S of every inverter unit 16 are turned off while the first switch SW1 is turned off and the second switch SW2 is turned on), showing the connection of the insulation resistances Rm (Rm1 to Rm3) of the motors M (M1 to M3) as an equivalent circuit.

Here, an RU-IGBT1 in FIG. 2 represents the equivalent insulation resistance of the three upper arm semiconductor switching elements Suu, Svu, Swu of the inverter unit 16a when they are in the off state. The RU-IGBT2 represents the equivalent insulation resistance of the three upper arm semiconductor switching elements Suu, Svu, and Swu of the inverter unit 16b when they are in the off state. The RU-IGBT3 represents the equivalent insulation resistance of the three upper arm semiconductor switching elements Suu, Svu, and Swu of the inverter unit 16c when they are in the off state. The equivalent insulation resistances RU-IGBT1, RU-IGBT2 and RU-IGBT3 are each the quotient obtained by dividing the voltage applied between the collector and the emitter of the three upper arm semiconductor switching elements Suu, Svu, Swu of the associated inverter unit 16a, 16b, 16c by the leakage current flowing from the collector to the emitter when they are in the off state.

On the other hand, the RD-IGBT1 shown in FIG. 2 represents the equivalent insulation resistance of the three lower arm semiconductor switching elements Sud, Svd, Swd of the inverter unit 16a when they are in the off state. The RD-IGBT2 represents the equivalent insulation resistance of the three lower arm semiconductor switching elements Sud, Svd, Swd of the inverter unit 16b when they are in the off state. The RD-IGBT3 represents the equivalent insulation resistance of the three lower arm semiconductor switching elements Sud, Svd, Swd of the inverter unit 16c when they are in the off state. The equivalent insulation resistances RD-IGBT1, RD-IGBT2 and RD-IGBT3 are each the quotient obtained by dividing the voltage applied between the collector and the emitter of the three lower arm semiconductor switching elements Sud, Svd, Swd of the associated inverter unit 16a, 16b, 16c by the leakage current flowing from the collector to the emitter when they are in the off state.

When putting the motor driving device 10 into the measurement preparation state, the switch control unit 32, based on the information indicative of a motor M selected as a measurement target by the measurement target selector 30, controls at least the semiconductor switching elements S of the inverter unit 16 that drives the motor M selected as the measurement target. This control will be described later in detail, but in short, the switch control unit 32 controls at least the semiconductor switching elements S of the inverter unit 16 that drives the measurement target motor M, so as to apply the capacitor voltage Vc across (so as to flow a current from the capacitor Ca through) only the insulation resistance Rm of the measurement target motor M, of the insulation resistances Rm of the three motors M.

Thereby, the motor driving device 10 is placed in the measurement state that enables the insulation resistance Rm of the measurement target motor M. At this time, the ground-referenced voltage Vm is detected by the first detector 18. It should be noted that the first detector 18 may detect the ground-referenced current Im. This ground-referenced current Im is a current that flows through the insulation resistance Rm of the measurement target motor M when in the measurement state.

In the measurement state, the convergence value estimator 34 estimates a convergence value C of the ground-referenced voltage Vm or ground-referenced current Im, based on multiple measurements of the ground-referenced voltage Vm or multiple measurements the ground-referenced current Im, detected at different detection times t by the first detector 18. The convergence value estimator 34 will be detailed later.

The insulation resistance calculator 36 calculates the insulation resistance Rm, based on the estimated convergence value C of the ground-referenced voltage Vm or the ground-referenced current Im obtained from the convergence value estimator 34, the capacitor voltage Vc detected by the second detector 20, and the detection resistor r1.

<Specific Control of Switch Control Unit 32>

Next, control of the switch control unit 32 will be described in detail.

When putting the motor driving device 10 into the measurement preparation state, the switch control unit 32 controls the inverter unit 16 connected to the measurement target motor M selected by the measurement target selector 30, so that, among the multiple semiconductor switching elements S, at least one of the semiconductor switching elements S connected to the second terminal (the other terminal) of the capacitor Ca (i.e, the terminal opposite to the first terminal of the capacitor Ca and connected to the ground through the second switch SW2) is turned on. Thereby, the motor coils Cu, Cv, Cw of the measurement target motor M have the same potential as the second terminal of the capacitor Ca.

In the present embodiment, since the terminal on the negative side of the capacitor Ca is adopted as the first terminal (one terminal), the switch control unit 32 may turn on at least one of the multiple upper arm semiconductor switching elements Suu, Svu, Swu of the inverter unit 16 connected to the motor M to be measured. As a result, the motor coils Cu, Cv, Cw of the motor M to be measured have the same potential as the positive terminal of the capacitor Ca. In this case, the semiconductor switching element S to be put into the ON state may be any of the U-phase, the V-phase and the W-phase semiconductor switching elements S, i.e., any of the multiple upper semiconductor switching elements Suu, Svu, Swu.

Figure 3:
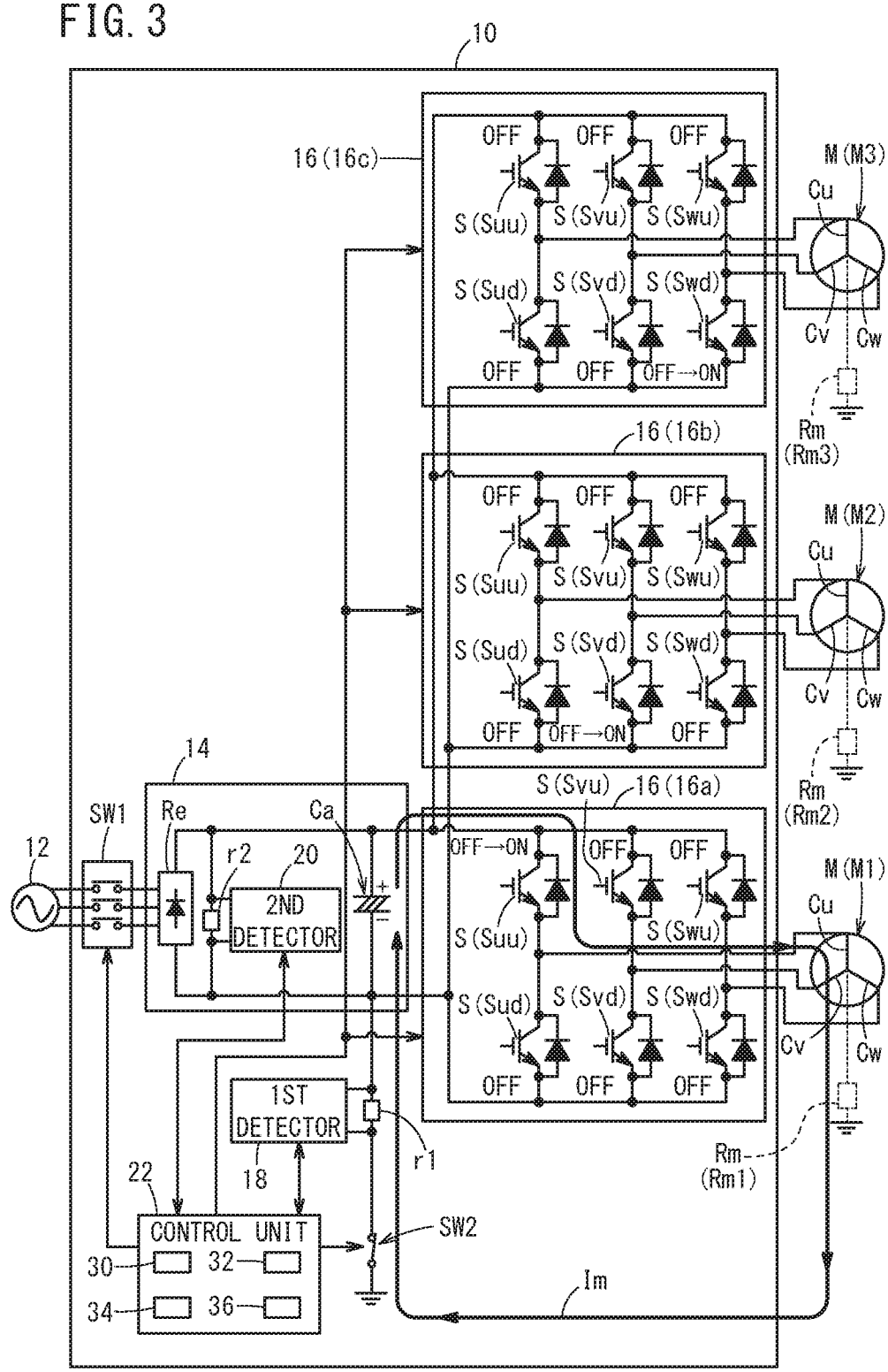
FIG. 3 is a diagram showing the flow of current when the motor driving device shown in FIG. 1 is in a measurement state.

In the example shown in FIG. 3, when the measurement target motor M is the motor M1, the U-phase upper arm semiconductor switching element Suu of the inverter unit 16a is placed in the ON state. With this configuration, for the inverter unit 16a connected to the measurement target motor M1, the capacitor Ca, the upper arm semiconductor switching element S in its ON state (the semiconductor switching element Suu in the example shown in FIG. 3), the insulation resistance Rm1 between the motor coils Cu, Cv, Cw of the measurement target motor M1 and the ground, and the detection resistor r1 jointly form a closed circuit.

Further, as to the inverter units 16 connected to the motors M other than the measurement target motor M selected by the measurement target selector 30, the switch control unit 32 turns on at least one of the multiple semiconductor switching elements S that are connected to the first terminal of the capacitors Ca (the capacitor Ca's terminal connected to the ground through the second switch SW2). As a result, all the motor coils Cu, Cv, Cw of the motors M other than the measurement target have the same potential as the first terminal of the capacitor Ca.

In the present embodiment, since the terminal on the negative side of the capacitor Ca is adopted as the first terminal, the switch control unit 32 only has to turn on at least one of the multiple lower arm semiconductor switching elements Sud, Svd, Swd of the inverter units 16 connected to the motors M other than the measurement target. As a result, the motor coils Cu, Cv, Cw of the motors M other than the measurement target have the same potential as the negative terminal of the capacitor Ca. In this case, the semiconductor switching element S to be put into the ON state may be any of the U-phase, the V-phase and the W-phase semiconductor switching elements S, that is, any of the multiple lower arm semiconductor switching elements Sud, Svd, Swd.

In the example shown in FIG. 3, the V-phase lower arm semiconductor switching element Svd of the inverter unit 16b is turned ON while the W-phase lower arm semiconductor switching element Swd of the inverter unit 16c is turned ON. This setting makes it possible to eliminate unnecessary current flowing to the detection resistor r1 via the motors M2 and M3 other than the measurement target motor.

Figure 4:
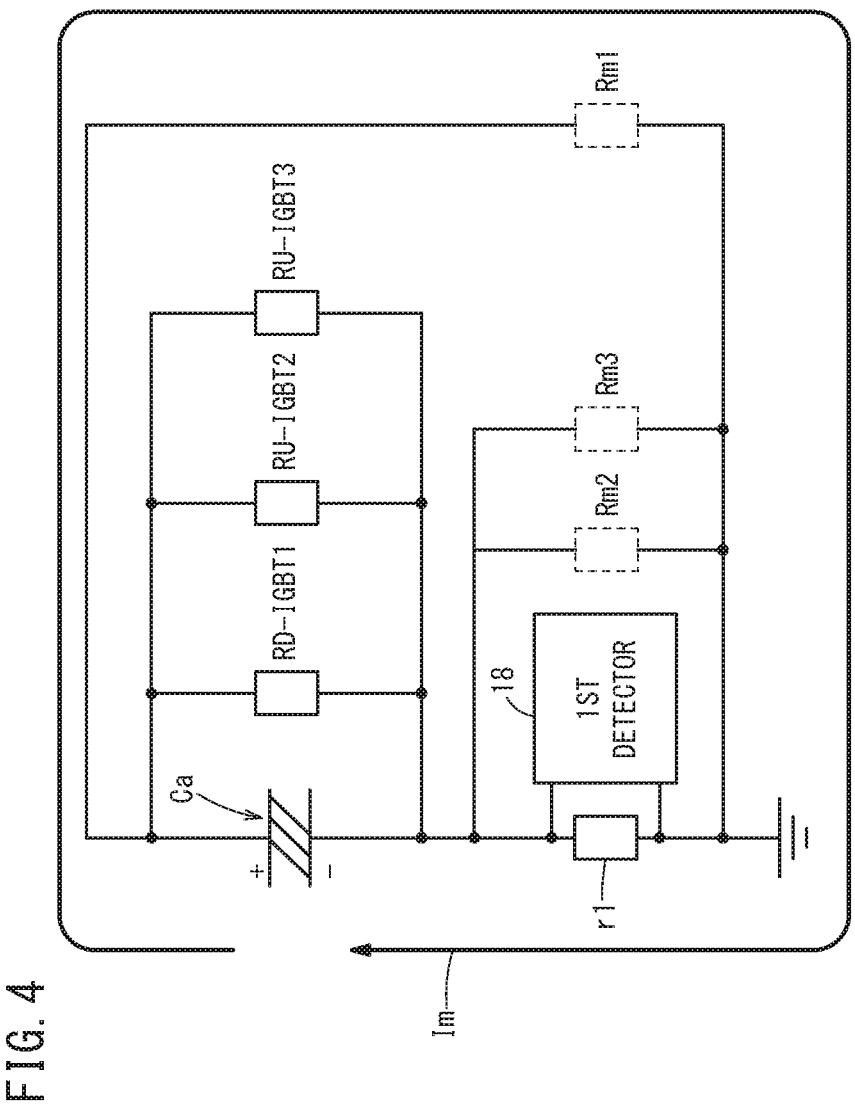
FIG. 4 is an equivalent circuit diagram showing the connection of the insulation resistance of the motor under a measurement state of the motor driving device shown in FIG. 1 using an equivalent circuit.

FIG. 4 is an equivalent circuit diagram showing an equivalent circuit where, in the equivalent circuit diagram shown in FIG. 2, the upper arm semiconductor switching element S of the inverter unit 16a for driving the measurement target motor M1 is turned on while the lower arm semiconductor switching elements S of the inverter units 16b and 16c for driving the motors M2, M3 other than the measurement target motor are turned on.

The equivalent circuit diagram of FIG. 4 is obtained by short-circuiting the equivalent insulation resistance RU-IGBT1 of the upper arm of the inverter unit 16a, the equivalent insulation resistance RD-IGBT2 of the lower arm of the inverter unit 16b, and the equivalent insulation resistance RD-IGBT3 of the lower arm of the inverter unit 16c in the equivalent circuit diagram of FIG. 2. As is apparent from FIG. 4, the equivalent insulation resistance RD-IGBT1 of the lower arm of the inverter unit 16a, the equivalent insulation resistance RU-IGBT2 of the upper arm of the inverter unit 16b, and the equivalent insulation resistance RU-IGBT3 of the upper arm of the inverter unit 16c are all connected to the positive-side terminal and the negative-side terminal of the capacitor Ca. Accordingly, leakage current flowing through these equivalent insulation resistors RD-IGBT1, RU-IGBT2 and RU-IGBT3 only flows from the terminal on the positive electrode side of the capacitor Ca to the terminal on the negative electrode side thereof, so that the leakage current does not flow through the detection resistor r1. Thus, it is understood that the measurement of the insulation resistance Rm1 of the measurement target motor M1 will not be affected at all. In other words, it is possible to consider that these equivalent insulation resistances RD-IGBT1, RU-IGBT2 and RU-IGBT3 do not exist when the insulation resistance Rm1 is measured.

At this time, the insulation resistances Rm2 and Rm3 of the motors M2 and M3 other than the measurement target are connected in parallel with the first detector 18. However, if the resistance of the detection resistor r1 is sufficiently smaller than the insulation resistances Rm2 and Rm3, the influence on the voltage detection and the current detection can be ignored. Therefore, it is possible to consider that the insulation resistances Rm2, Rm3 of the motors M2, M3 other than the measurement target do not exist when the insulation resistance Rm1 is measured. It is noted that measurement may be carried out by turning off all the lower arm semiconductor switching elements S so as to obtain the resistance value when the insulation resistances Rm (Rm1 to Rm3) of all the motors M (M1 to M3) are connected in parallel and then the influence of Rm2 and Rm3 may be compensated by using the obtained resistance value.

Thus, it is possible to improve the accuracy with which the insulation resistance calculator 36 calculates the insulation resistance Rm of the measurement target motor M.

<Specific Estimation Process of Convergence Value Estimator 34>

Next, the convergence value estimator 34 will be described in detail. First, the estimation of the convergence value C of the ground-referenced voltage Vm will be explained, and thereafter the estimation of the convergence value C of the ground-referenced current Im will be described.

<Estimation of Convergence Value C of Ground-Referenced Voltage Vm>

Figure 5:
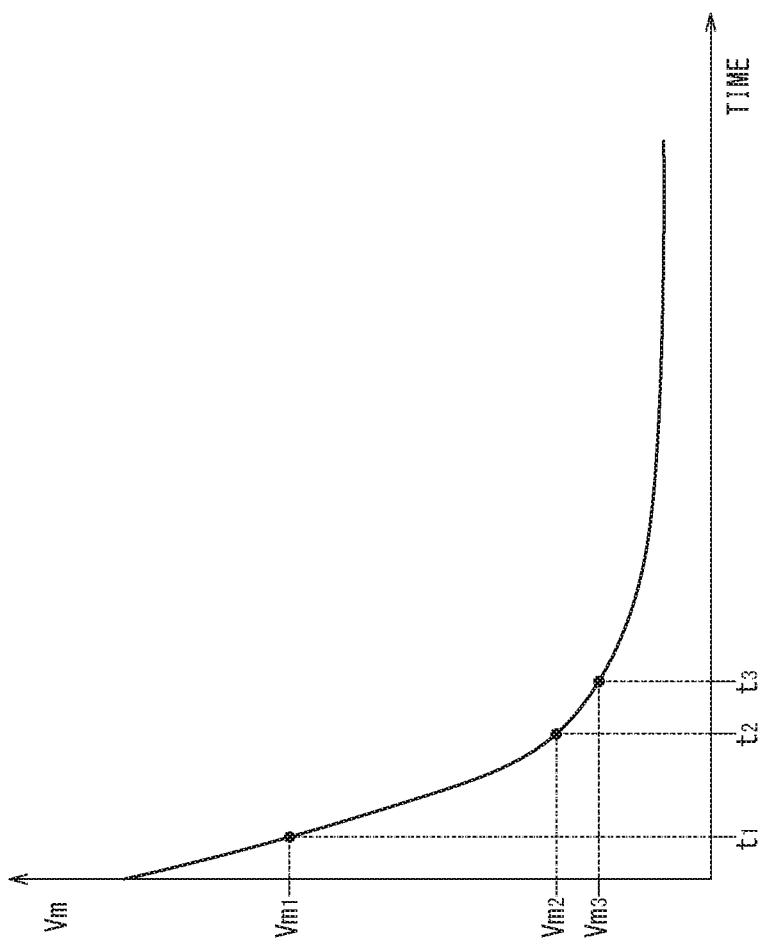
FIG. 5 is a waveform diagram showing an example of the relationship between ground-referenced voltage and time in a measurement state, to explain how a convergence value estimator estimates a convergence value of ground-referenced voltage.

FIG. 5 is a waveform chart showing an example of the relationship between the ground-referenced voltage Vm detected by the first detector 18 and time. When the measurement state is brought about in which the insulation resistance Rm of the measurement target motor M can be measured, the ground-referenced voltage Vm decreases with the passage of time after the voltage of the capacitor Ca has been applied across the detection resistor r1, and finally substantially converges to a fixed value.

The convergence value estimator 34 estimates the convergence value C of the ground-referenced voltage Vm based on multiple measurements of the ground-referenced voltage Vm detected by the first detector 18 at different detection times t. In FIG. 5, $t_1$ to $t_3$ each indicate the detection time t of the first detector 18. $Vm_1$ indicates the ground-referenced voltage Vm detected by the first detector 18 at the detection time $t_1$, $Vm_2$ indicates the ground-referenced voltage Vm detected by the first detector 18 at the detection time $t_2$, and $Vm_3$ indicates the ground-referenced voltage Vm detected by the first detector 18 at the detection time $t_3$.

Based on three detection times t ($t_1$ to $t_3$) and three measurements of the ground-referenced voltage Vm ($Vm_1$ to $Vm_3$) detected at three respective detection times t ($t_1$ to $t_3$), the convergence value estimator 34 estimates or predicts the convergence value C of the ground-referenced voltage Vm.

Here, the relationship between detection time t and the ground-referenced voltage Vm detected at the detection time t can be expressed by the following equation (1). In this equation (1), C is the convergence value, and A and b are constants which are determined by the parasitic capacitance, voltage, etc., of the system at the time of measurement.

$$Vm = Ae^{-bt} + C \quad (1)$$

Accordingly, the relationship between the detection time $t_1$ and the ground-referenced voltage $Vm_1$ is given by the following equation (2). Similarly, the relationship between the detection time $t_2$ and the ground-referenced voltage $Vm_2$ is given by the following equation (3), and the relationship between the detection time $t_3$ and the ground-referenced voltage $Vm_3$ is given by the following equation (4).

$$Vm_1 = Ae^{-bt_1} + C \quad (2)$$

$$Vm_2 = Ae^{-bt_2} + C \quad (3)$$

$$Vm_3 = Ae^{-bt_3} + C \quad (4)$$

From the equations (2) to (4), the following equation (5) can be derived.

$$Vm_3 = (Vm_1 - C)\left(\frac{Vm_2 - C}{Vm_1 - C}\right)^{\frac{t_3 - t_1}{t_2 - t_1}} + C \quad (5)$$

When this equation (5) is Taylor-expanded around $C = C_0$, and rearranged with respect to the convergence value C, the following equation (6) can be derived. Note that $C_0$ is a predetermined constant.

$$C = \frac{Vm_3 - \alpha - C_0}{1 - \alpha\beta} + C_0 \quad (6)$$

where $$\alpha = (Vm_1 - C_0)^{\frac{t_2 - t_3}{t_2 - t_1}} (Vm_2 - C_0)^{\frac{t_3 - t_1}{t_2 - t_1}}$$

$$\beta = \left(\frac{1}{Vm_1 - C_0} \times \frac{t_2 - t_3}{t_2 - t_1} + \frac{1}{Vm_2 - C_0} \times \frac{t_3 - t_1}{t_2 - t_1}\right)$$

Therefore, the convergence value estimator 34 can estimate (calculate) the convergence value C of the ground-referenced voltage Vm, using Eq. (6) based on the multiple measurements of the ground-referenced voltage Vm detected by the first detector 18 at multiple different detection times t.

Here, when the time interval between detection times t ($t_1$ to $t_3$) is a constant value $\Delta t$, that is, when $t_2 = t_1 + \Delta t$, $t_3 = t_2 + \Delta t = t_1 + 2 \times \Delta t$, the above equation (5) can be rewritten as the following equation (7).

$$Vm_3 = (Vm_1 - C)\left(\frac{Vm_2 - C}{Vm_1 - C}\right)^2 + C \quad (7)$$

By rearranging Eq. (7) with respect to the convergence value C, the following equation (8) can be derived.

$$C = \frac{Vm_1 \times Vm_3 - Vm_2^2}{Vm_1 + Vm_3 - 2 \times Vm_2} \quad (8)$$

Therefore, when the time interval between the detection times t ($t_1$ to $t_3$) is the constant value $\Delta t$, the convergence value estimator 34 can estimate (calculate) the convergence value C of the ground-referenced voltage Vm, using Eq. (8) based on the multiple measurements of the ground-referenced voltage Vm detected by the first detector 18 at multiple different detection times t. Thus, the calculation process (estimation process) of the convergence value C can be simplified.

<Estimation of Convergence Value C of Ground-Referenced Current Im>

Figure 6:
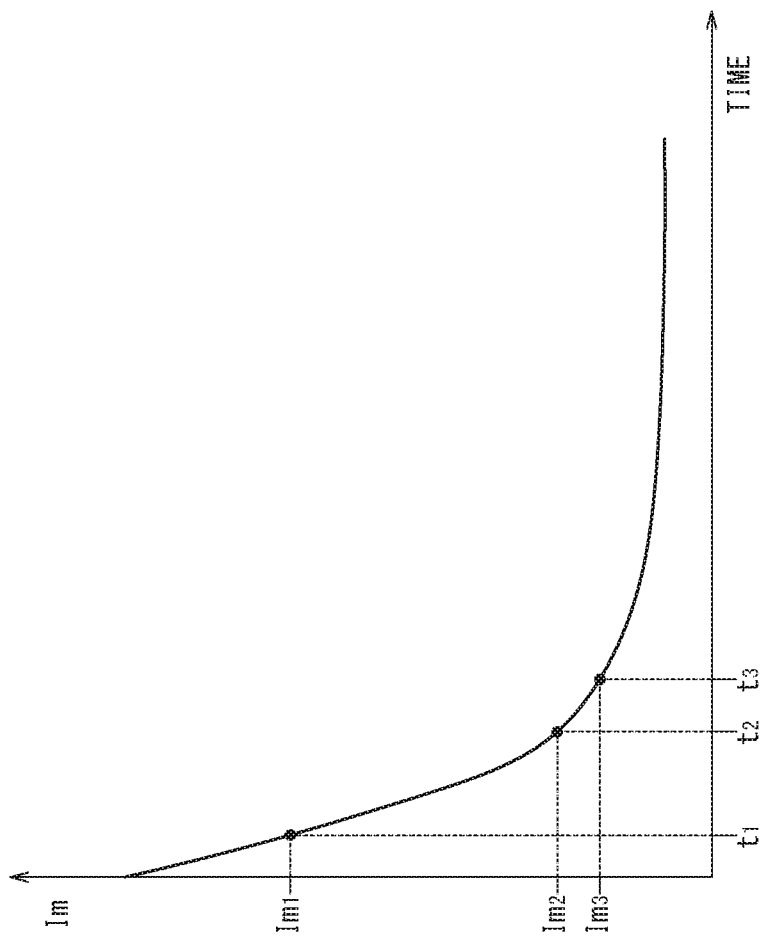
FIG. 6 is a waveform diagram showing an example of the relationship between ground-referenced current and time in a measurement state, to explain how a convergence value estimator estimates a convergence value of ground-referenced current.

FIG. 6 is a waveform chart showing an example of the relationship between the ground-referenced current Im detected by the first detector 18 and time. When the measurement state is brought about in which the insulation resistance Rm of the measurement target motor M can be measured, the ground-referenced current Im decreases with the passage of time and finally substantially converges to a fixed value.

The convergence value estimator 34 estimates the convergence value C of the ground-referenced current Im based on the multiple measurements of the ground-referenced current Im detected by the first detector 18 at different detection times t. In FIG. 6, $t_1$ to $t_3$ each indicate the detection time t of the first detector 18. $Im_1$ indicates the ground-referenced current Im detected by the first detector 18 at the detection time $t_1$, $Im_2$ indicates the ground-referenced current Im detected by the first detector 18 at the detection time $t_2$, and $Im_3$ indicates the ground-referenced current Im detected by the first detector 18 at the detection time $t_3$.

Based on the three detection times t ($t_1$ to $t_3$) and the three measurements of the ground-referenced current Im ($Im_1$ to $Im_3$) detected at three respective detection times t ($t_1$ to $t_3$), the convergence value estimator 34 estimates or predicts the convergence value C of the ground-referenced current Im.

Here, the relationship between the detection time t and the ground-referenced current Im detected at the detection time t can be expressed by the following equation (9). In this equation (9), C is the convergence value, and A and b are constants which are determined by the parasitic capacitance, voltage, etc. of the system at the time of measurement.

$$Im = Ae^{-bt} C \tag{9}$$

Accordingly, the relationship between the detection time $t_1$ and the ground-referenced current $Im_1$ is given by the following equation (10). Similarly, the relationship between the detection time $t_2$ and the ground-referenced current $Im_2$ is given by the following equation (11), and the relationship between the detection time $t_3$ and the ground-referenced current $Im_3$ is given by the following equation (12).

$$Im_1 = Ae^{-bt_1} + C \tag{10}$$

$$Im_2 = Ae^{-bt_2} + C \tag{11}$$

$$Im_3 = Ae^{-bt_3} + C \tag{12}$$

From the equations (10) to (12), the following equation (13) can be derived.

$$Im_3 = (Im_1 - C)\left(\frac{Im_2 - C}{Im_1 - C}\right)^{\frac{t_3 - t_1}{t_2 - t_1}} + C \tag{13}$$

When this equation (13) is Taylor-expanded around $C = C_0$, and rearranged with respect to the convergence value C, the following equation (14) can be derived. Note that $C_0$ is a predetermined constant.

$$C = \frac{Im_3 - \alpha - C_0}{1 - \alpha\beta} + C_0 \tag{14}$$

where $$\alpha = (Im_1 - C_0)^{\frac{t_2 - t_3}{t_2 - t_1}} (Im_2 - C_0)^{\frac{t_3 - t_1}{t_2 - t_1}}$$

$$\beta = \left(\frac{1}{Im_1 - C_0} \times \frac{t_2 - t_3}{t_2 - t_1} + \frac{1}{Im_2 - C_0} \times \frac{t_3 - t_1}{t_2 - t_1}\right)$$

Therefore, the convergence value estimator 34 can estimate (calculate) the convergence value C of the ground-referenced current Im, using Eq. (14) based on the multiple measurements of the ground-referenced current Im detected by the first detector 18 at multiple different detection times t.

Here, when the time interval between the detection times t ($t_1$ to $t_3$) is a constant value $\Delta t$, that is, when $t_2 = t_1 + \Delta t$, $t_3 = t_2 + \Delta t = t_1 + 2 \times \Delta t$, the above equation (13) can be rewritten by the following equation (15).

$$Im_3 = (Im_1 - C)\left(\frac{Im_2 - C}{Im_1 - C}\right)^2 + C \tag{15}$$

By rearranging Eq. (15) with respect to the convergence value C, the following equation (16) can be derived.

$$C = \frac{Im_1 \times Im_3 - Im_2^2}{Im_1 + Im_3 - 2 \times Im_2} \tag{16}$$

Therefore, when the time interval of the detection time t ($t_1$ to $t_3$) is the constant value $\Delta t$, the convergence value estimator 34 can estimate (calculate) the convergence value C of the ground-referenced current Im, using Eq. (16) based on the multiple measurements of the ground-referenced current Im detected by the first detector 18 at multiple different detection times t. Thus, the calculation process (estimation process) of the convergence value C can be simplified.

In the above examples, the convergence value C is estimated using three measurements of the ground-referenced voltage Vm or three measurements of the ground-referenced current Im, detected at three different detection times t, but the convergence value C may be estimated using four or more measurements of the ground-referenced voltage Vm or four or more measurements of the ground-referenced current Im, detected at four or more different detection times t. For example, it is possible to estimate the convergence value C by selecting any three detection times t from four or more different detection times t. Alternatively, four or more measurements of the ground-referenced voltage Vm, or four or more measurements of the ground-referenced current Im, detected at four or more different detection times t may be used to prepare three averaged values. At this time, the detection times should be averaged correspondingly to the averaged value.

As described above, in the present embodiment, since the convergence value C of the ground-referenced voltage Vm or the ground-referenced current Im is estimated, it is possible to estimate the convergence value C before the ground-referenced voltage Vm or the ground-referenced current Im converges. Therefore, the time required for measuring the insulation resistance Rm of the motor M can be shortened.

<Operation of Motor Driving Device 10>

Figure 7:
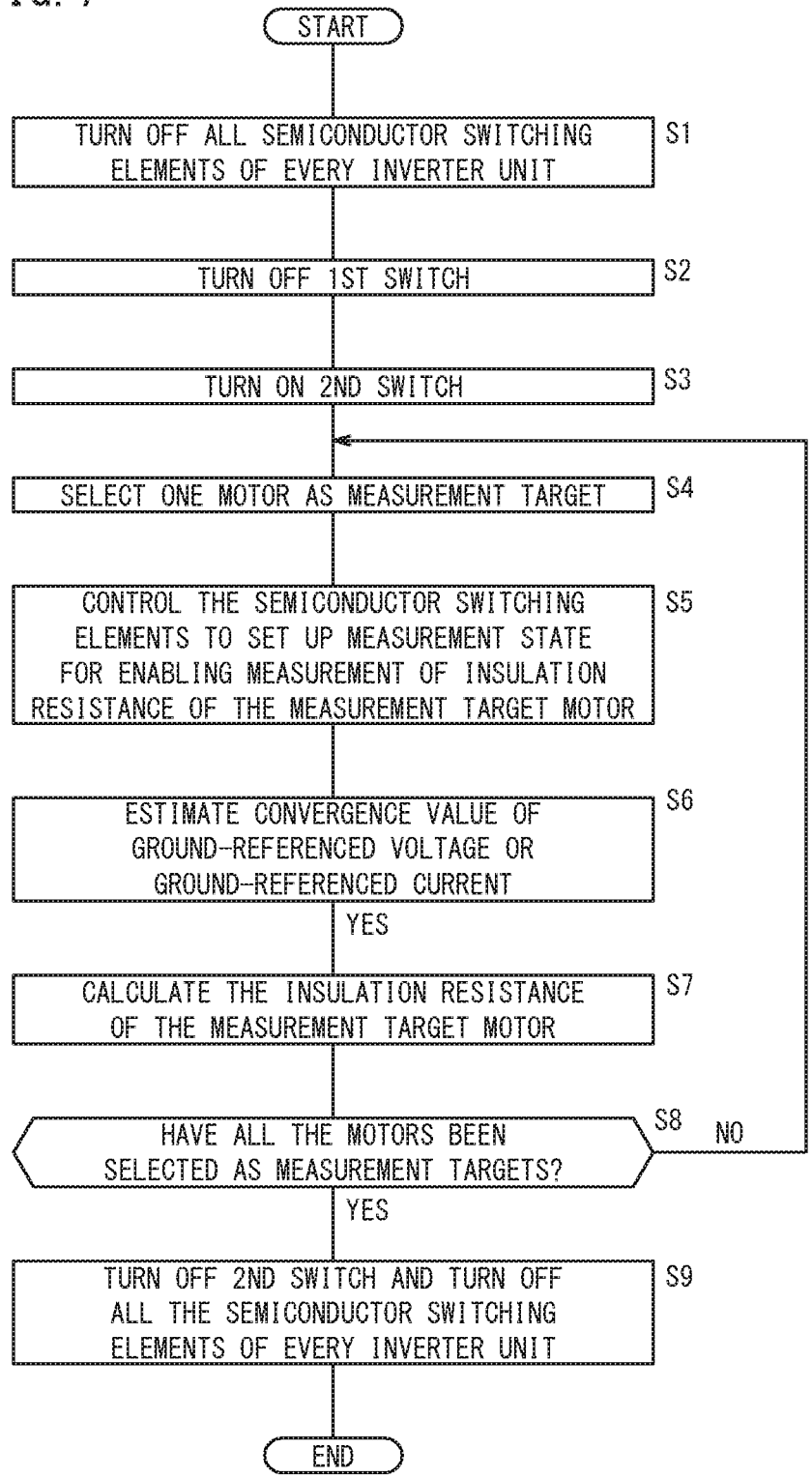
FIG. 7 is a flowchart showing how the motor driving device performs a measuring operation of insulation resistance.

Next, the operation of the motor driving device 10 to measure the insulation resistance Rm will be described with reference to the flowchart shown in FIG. 7. At step S1, the switch control unit 32 turns off all the multiple semiconductor switching elements S (Suu, Svu, Swu, Sud, Svd, Swd) of every inverter unit 16 (16a, 16b, 16c). As a result, all the motors M (M1 to M3) are deactivated.

Next, at step S2, the switch control unit 32 turns off the first switch SW1. As a result, the supply of the AC voltage from the AC power supply 12 to the motor driving device 10 is shut off.

Then, at step S3, the switch control unit 32 turns on the second switch SW2. This creates a state in which the negative side terminal (the first terminal) of the capacitor Ca is connected to the ground. As a result, the motor driving device 10 enters the measurement preparation state, which is represented by the equivalent circuit in FIG. 2.

At step S4, the measurement target selector 30 selects one of the motors M (M1 to M3) as a measurement target. At this time, the measurement target selector 30 selects a motor M which has not yet been selected as the measurement target.

Next, at step S5, the switch control unit 32 controls the semiconductor switching elements S of the multiple inverter units 16 (16a, 16b, 16c) so as to set up the measurement state in which the insulation resistance Rm of the measurement target motor M selected at step S4 can be measured.

Specifically, with regard to the inverter unit 16 connected to the motor M to be measured, the switch control unit 32 turns on one of the upper arm semiconductor switching elements S connected to the positive terminal (the second terminal) of the capacitor Ca. Further, with regard to the inverter units 16 connected to the motors M other than the measurement target motor, the switch control unit 32 turns on one of the lower arm semiconductor switching elements S connected to the negative terminal (the first terminal) of the capacitor Ca. As a result, when, for example, the motor M1 is the measurement target motor M, the equivalent circuit shown in FIG. 2 is changed into the state as shown in FIG. 4. Therefore, the current from the capacitor Ca flows through the insulation resistance Rm1 of the measurement target motor M1 and the detection resistor r1, and returns to the capacitor Ca.

Next, at step S6, the convergence value estimator 34 estimates the convergence value C of the ground-referenced voltage Vm or the ground-referenced current Im based on multiple measurements of the ground-referenced voltage Vm (Vm$_1$ to Vm$_3$), or multiple measurements of the ground-referenced current Im (Im$_1$ to Im$_3$), detected by the first detector 18 at different detection times t (t$_1$ to t$_3$). Specifically, the convergence value estimator 34 calculates (estimates) the convergence value C by using the above-described equation (6) or equation (14). When the time interval between the multiple detection times t to (t$_1$ to t$_3$) is a constant value Δt, the convergence value estimator 34 calculates (estimates) the convergence value C, based on the above-described equation (8) or equation (16).

Next, at step S7, based on the convergence value C estimated by the convergence value estimator 34 and the capacitor voltage Vc detected by the second detector 20, the insulation resistance calculator 36 calculates the insulation resistance Rm of the measurement target motor M1.

Next, at step S8, the measurement target selector 30 determines whether or not all the motors M have been selected as measurement targets. That is, the measurement target selector 30 determines whether there is still any motor M not selected as a measurement target. If it is determined at step S8 that not all the motors M have been selected as measurement targets, that is, if there is a motor M that has not yet been selected as a measurement target, the control returns to step S4.

If it is determined at step S8 that all the motors M have been selected as measurement targets, the control proceeds to step S9, in which the switch control unit 32 turns off the second switch SW2, and also turns off all the multiple semiconductor switching elements S of every inverter unit 16 (16a to 16c). As a result, the measurement operation is terminated.

MODIFIED EXAMPLES

The above embodiment can also be modified as follows.

Modified Example 1

In the above description of the embodiment, the negative terminal of the capacitor Ca is taken as the first terminal, but the positive terminal of the capacitor Ca may be adopted as the first terminal. In this case, the positive terminal of the capacitor Ca is connected to the ground via the second switch SW2 while the detection resistor r1 is connected in series with the second switch SW2 between the positive terminal (the first terminal) of the capacitor Ca and the ground. Also in this case, the insulation resistance Rm of the motor M can be measured.

Modified Example 2

In the above embodiment, the insulation resistance calculator 36 calculates the insulation resistance Rm using the convergence value C estimated once by the convergence value estimator 34. However, if there is a deviation between the convergence value C estimated by the convergence value estimator 34 and the actual convergence value C, then the calculated insulation resistance Rm may become different from the actual insulation resistance Rm.

To deal with such a situation, in modified example 2, the convergence value estimator 34 estimates (calculates) the convergence value C at least two times. When the difference ΔC between the previously-estimated convergence value C and the currently-estimated convergence value C is smaller than a reference value SV, the estimation of the convergence value C is terminated. If the difference ΔC is equal to or greater than the reference value SV, the estimation of the convergence value C is continued. As a result, the reliability of the calculated convergence value C can be improved. Then, after completion of the estimation of the convergence value C, the insulation resistance calculator 36 calculates the insulation resistance Rm.

Specifically, the convergence value estimator 34 first calculates the convergence value C of the ground-referenced voltage Vm or the ground-referenced current Im, based on multiple measurements of the ground-referenced voltage Vm or the ground-referenced current Im, detected by the first detector 18 at different detection times t. Thereafter, the convergence value estimator 34 calculates the convergence value C once again, based on multiple measurements of the ground-referenced voltage Vm or the ground-referenced current Im detected by the first detector 18 at multiple detection times t, at least one of which is different from the detection times used in the previous calculation for the convergence value C of the ground-referenced voltage Vm or the ground-referenced current Im.

Figure 8:
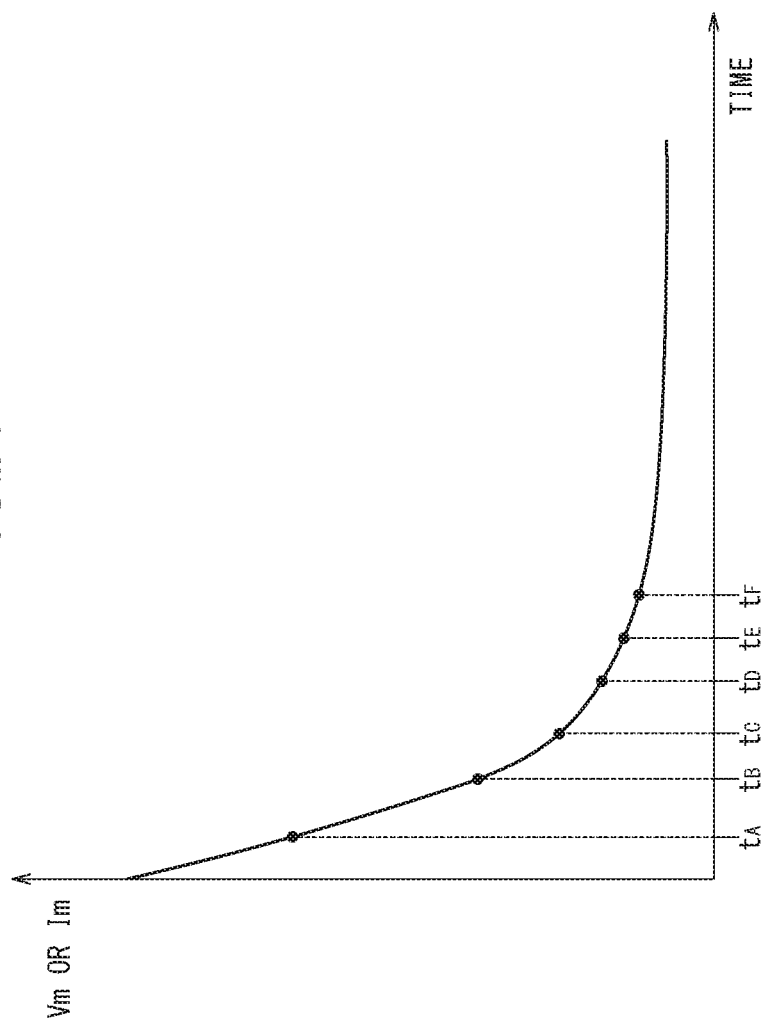
FIG. 8 is a diagram for explaining a modified example 2, showing an example of the detection timing of the ground-referenced voltage or the ground-referenced current by a first detector.

FIG. 8 is a diagram for explaining modified example 2, showing an example of detection times t for the ground-referenced voltage Vm or the ground-referenced current Im by the first detector 18. For example, suppose that the convergence value estimator 34 first estimates the convergence value C based on the multiple measurements of the ground-referenced voltage Vm or the ground-referenced current Im, detected at the detection times $t_A$, $t_B$, $t_C$. Thereafter, the convergence value estimator 34 may again estimate the convergence value C, based on the multiple measurements of the ground-referenced voltage Vm or the ground-referenced current Im, detected at the detection times $t_B$, $t_C$, $t_D$, or based on ones detected at the detection times $t_D$, $t_E$, $t_F$.

In this way, when estimating the convergence value C once again, the convergence value estimator 34 may calculate the convergence value C based on the multiple measurements of the ground-referenced voltage Vm or the ground-referenced current Im that are detected by the first detector 18 at multiple detection times t at least one of which is different from the previous detection times t.

It is preferable that the insulation resistance calculator 36 calculates the insulation resistance Rm using the last-estimated convergence value C among the multiple convergence values C estimated by the convergence value estimator 34. Owing to this, the insulation resistance Rm can be measured (calculated) with higher accuracy.

Modified Example 3

The modified examples 1 and 2 may be combined.
[Technical Ideas Obtained from Embodiment]
Technical ideas that can be grasped from the above embodiment and modified examples 1 to 3 will be described below.
<First Technical Idea>

The motor driving device (10) for driving a plurality of motors (M), includes: a rectifier circuit (Re) configured to rectify an AC voltage supplied from an AC power supply (12) via a first switch (SW1) to thereby obtain a DC voltage; a capacitor (Ca) configured to smooth the DC voltage obtained by the rectifier circuit (Re); a plurality of inverter units (16) each including upper arm semiconductor switching elements (S) configured to connect a positive-side terminal of the capacitor (Ca) with motor coils (Cu, Cv, Cw) of a corresponding one of the motors (M), and lower arm semiconductor switching elements (S) configured to connect a negative-side terminal of the capacitor (Ca) with the motor coils (Cu, Cv, Cw), the inverter units being configured to drive the motors (M) by converting a capacitor voltage (Vc) across the capacitor (Ca) into an AC voltage by switching operation of the upper arm semiconductor switching elements (S) and the lower arm semiconductor switching elements (S); a second switch (SW2) configured to connect one terminal of the positive-side terminal and the negative-side terminal of the capacitor (Ca) to ground; a first detector (18) configured to detect a ground-referenced current (Im) flowing between the one terminal of the capacitor (Ca) and the ground, or a ground-referenced voltage (Vm) between the one terminal of the capacitor (Ca) and the ground; a second detector (20) configured to detect the capacitor voltage (Vc) across the capacitor (Ca); a switch control unit (32) configured to establish a measurement state for enabling measurement of an insulation resistance (Rm) of a measurement target motor (M) of the motors by turning off the upper arm semiconductor switching elements (S) and the lower arm semiconductor switching elements (S) of all the multiple inverter units (16) to thereby stop operation of every motor (M) while turning off the first switch (SW1) and turning on the second switch (SW2), then turning on a semiconductor switching element (S) that is connected to another terminal of the capacitor (Ca), among the upper arm and lower arm semiconductor switching elements (S) to which the motor coils (Cu, Cv, Cw) of the measurement target motor (M) are connected, and turning on a semiconductor switching element (S) that is connected to the one terminal of the capacitor (Ca), among the upper arm and lower arm semiconductor switching elements (S) to which the motor coils (Cu, Cv, Cw) of each of the motors (M) other than the measurement target motor (M) are connected; a convergence value estimator (34) configured to estimate a convergence value (C) of the ground-referenced current (Im) or the ground-referenced voltage (Vm), based on multiple measurements of the ground-referenced current (Im) or the ground-referenced voltage (Vm), detected by the first detector (18) at different detection times (t) from one another in the measurement state; and an insulation resistance calculator (36) configured to calculate the insulation resistance (Rm) of the measurement target motor (M), based on the convergence value (C) and the capacitor voltage (Vc).

As a result, it is possible to estimate the convergence value (C) of the ground-referenced current (Im) or the ground-referenced voltage (Vm) before convergence of the ground-referenced current (Im) or the ground-referenced voltage (Vm). Therefore, it is possible to shorten the time required for measuring the insulation resistance (Rm) of the motor (M).

After the estimation of the convergence value (C), the convergence value estimator (34) may again estimate the convergence value (C), based on multiple measurements of the ground-referenced current (Im) or the ground-referenced voltage (Vm), detected by the first detector (18) at multiple detection times (t), at least one of which is different from the multiple detection times (t) for the previous estimation, continue to estimate the convergence value (C) if the difference (ΔC) between the previous convergence value (C) and the current convergence value (C) is equal to or greater than a reference value (SV), and terminate estimation of the convergence value (C) if the difference (ΔC) is smaller than the reference value (SV). The insulation resistance calculator (36) may calculate the insulation resistance (Rm) after the termination of estimation of the convergence value (C). This improves the reliability of the estimated convergence value (C).

The insulation resistance calculator (36) may calculate the insulation resistance (Rm) using the last-estimated convergence value (C) among the plurality of estimated convergence values (C). Owing thereto, the insulation resistance (Rm) can be measured (calculated) more accurately.

The convergence value estimator (34) may calculate the convergence value (C) of the ground-referenced voltage (Vm) using the above equation (6). In the equation, $t_1$, $t_2$ and $t_3$ are the detection times (t), $Vm_1$, $Vm_2$ and $Vm_3$ are measurements of the ground-referenced voltage (Vm) detected respectively at the detection times $t_1$, $t_2$ and $t_3$, $C_0$ is a predetermined constant, and of the detection times $t_1$ to $t_3$, $t_1$ is the earliest and $t_3$ is the latest. Owing thereto, it is possible to estimate (calculate) the convergence value (C) of the ground-referenced voltage (Vm) with high accuracy.

The convergence value estimator (34) may calculate the convergence value (C) of the ground-referenced voltage (Vm) using the above equation (8). In the equation, $Vm_1$, $Vm_2$ and $Vm_3$ are measurements of the ground-referenced voltage (Vm) detected respectively at the detection times $t_1$, $t_2$ and $t_3$, and as to the detection times $t_1$ to $t_3$, a time interval between the detection times adjacent to each other is a fixed value ($\Delta t$), and $t_1$ is the earliest and $t_3$ is the latest. As a result, it is possible to estimate (calculate) the convergence value (C) of the ground-referenced voltage (Vm) with high accuracy and simplify the estimation process (calculation process).

The convergence value estimator (34) may calculate the convergence value (C) of the ground-referenced current (Im) using the above equation (14). In the equation, $t_1$, $t_2$ and $t_3$ are the detection times (t), $Im_1$, $Im_2$ and $Im_3$ are measurements of the ground-referenced current (Im) detected respectively at the detection times $t_1$, $t_2$ and $t_3$, $C_0$ is a predetermined constant, and of the detection times $t_1$ to $t_3$, $t_1$ is the earliest and $t_3$ is the latest. Owing thereto, it is possible to estimate (calculate) the convergence value (C) of the ground-referenced current (Im) with high accuracy.

The convergence value estimator (34) may calculate the convergence value (C) of the ground-referenced current (Im) using the above equation (16). In the equation, $Im_1$, $Im_2$ and $Im_3$ are measurements of the ground-referenced current (Im) detected respectively at the detection times $t_1$, $t_2$ and $t_3$, and as to the detection times $t_1$ to $t_3$, a time interval between the detection times adjacent to each other is a fixed value ($\Delta t$), and $t_1$ is the earliest and $t_3$ is the latest. As a result, it is possible to estimate (calculate) the convergence value (C) of the current to ground (Im) with high accuracy and simplify the estimation process (calculation process).

<Second Technical Idea>

The second technical idea resides in a measuring method by which a motor driving device (10) for driving a plurality of motors (M) measures an insulation resistance (Rm) of the motor (M). The motor driving device (10) includes: a rectifier circuit (Re) configured to rectify an AC voltage supplied from an AC power supply (12) via a first switch (SW1) to thereby obtain a DC voltage; a capacitor (Ca) configured to smooth the DC voltage obtained by the rectifier circuit (Re); a plurality of inverter units (16) each including upper arm semiconductor switching elements (S) configured to connect the positive-side terminal of the capacitor (Ca) with motor coils (Cu, Cv, Cw) of a corresponding one of the motors (M), and lower arm semiconductor switching elements (S) configured to connect the negative-side terminal of the capacitor (Ca) with the motor coils (Cu, Cv, Cw), the inverter units being configured to drive the motors (M) by converting the capacitor voltage (Vc) across the capacitor (Ca) into an AC voltage by switching operation of the upper arm semiconductor switching elements (S) and the lower arm semiconductor switching elements (S); a second switch (SW2) configured to connect one terminal of the positive-side terminal and the negative-side terminal of the capacitor (Ca) to the ground; a first detector (18) configured to detect a ground-referenced current (Im) flowing between the one terminal of the capacitor (Ca) and the ground, or a ground-referenced voltage (Vm) between the one terminal of the capacitor (Ca) and the ground; and a second detector (20) configured to detect the capacitor voltage (Vc) across the capacitor (Ca). The measuring method includes: a switch control step of establishing a measurement state for enabling measurement of the insulation resistance (Rm) of a measurement target motor (M) of the motors by turning off the upper arm semiconductor switching elements (S) and the lower arm semiconductor switching elements (S) of all the multiple inverter units (16) to thereby stop the operation of every motor (M) while turning off the first switch (SW1) and turning on the second switch (SW2), then turning on a semiconductor switching element (S) that is connected to another terminal of the capacitor (Ca), among the upper arm and lower arm semiconductor switching elements (S) to which the motor coils (Cu, Cv, Cw) of the measurement target motor (M) are connected, and turning on a semiconductor switching element (S) that is connected to the one terminal of the capacitor (Ca), among the upper arm and lower arm semiconductor switching elements (S) to which the motor coils (Cu, Cv, Cw) of each of the motors (M) other than the measurement target motor (M) are connected; a convergence value estimating step of estimating a convergence value (C) of the ground-referenced current (Im) or the ground-referenced voltage (Vm), based on multiple measurements of the ground-referenced current (Im), or the ground-referenced voltage (Vm), detected by the first detector (18) at different detection times (t) from one another in the measurement state; and an insulation resistance calculating step of calculating the insulation resistance (Rm) of the measurement target motor (M), based on the convergence value (C) and the capacitor voltage (Vc).

As a result, it is possible to estimate the convergence value (C) of the ground-referenced current (Im) or the ground-referenced voltage (Vm) before convergence of the ground-referenced current (Im) or the ground-referenced voltage (Vm). Therefore, it is possible to shorten the time required for measuring the insulation resistance (Rm) of the motor (M).

After the estimation of the convergence value (C), the convergence value estimating step may again estimate the convergence value (C), based on multiple measurements of the ground-referenced current (Im) or the ground-referenced voltage (Vm), detected by the first detector (18) at multiple detection times (t), at least one of which is different from the multiple detection times (t) for the previous estimation, and continues to estimate the convergence value (C) if the difference ($\Delta C$) between the previous convergence value (C) and the current convergence value (C) is equal to or greater than a reference value (SV), and terminates estimation of the convergence value (C) if the difference ($\Delta C$) is smaller than the reference value (SV). The insulation resistance calculating step may calculate the insulation resistance (Rm) after the termination of estimation of the convergence value (C). This improves the reliability of the estimated convergence value (C).

The insulation resistance calculating step may calculate the insulation resistance (Rm) using the last-estimated convergence value (C) among the plurality of estimated convergence values (C). Owing thereto, the insulation resistance (Rm) can be measured (calculated) more accurately.

The convergence value estimating step may calculate the convergence value (C) of the ground-referenced voltage (Vm) using the above equation (6). In the equation, $t_1$, $t_2$ and $t_3$ are the detection times (t), $Vm_1$, $Vm_2$ and $Vm_3$ are measurements of the ground-referenced voltage (Vm) detected respectively at the detection times $t_1$, $t_2$ and $t_3$, $C_0$ is a predetermined constant, and of the detection times $t_1$ to $t_3$, $t_1$ is the earliest and $t_3$ is the latest. Owing thereto, it is possible to estimate (calculate) the convergence value (C) of the ground-referenced voltage (Vm) with high accuracy.

The convergence value estimating step may calculate the convergence value (C) of the ground-referenced voltage (Vm) using the above equation (8). In the equation, $Vm_1$, $Vm_2$ and $Vm_3$ are measurements of the ground-referenced voltage (Vm), detected respectively at the detection times $t_1$, $t_2$ and $t_3$, and as to the detection times $t_1$ to $t_3$, the time interval between the detection times adjacent to each other is a fixed value ($\Delta t$), and $t_1$ is the earliest and $t_3$ is the latest. As a result, it is possible to estimate (calculate) the convergence value (C) of the ground-referenced voltage (Vm) with high accuracy and simplify the estimation process (calculation process).

The convergence value estimating step may calculate the convergence value (C) of the ground-referenced current (Im) using the above equation (14). In the equation, $t_1$, $t_2$ and $t_3$ are the detection times (t), $Im_1$, $Im_2$ and $Im_3$ are measurements of the ground-referenced current (Im) detected respectively at the detection times $t_1$, $t_2$ and $t_3$, $C_0$ is a predetermined constant, and of the detection times $t_1$ to $t_3$, $t_1$ is the earliest and $t_3$ is the latest. As a result, it is possible to estimate (calculate) the convergence value (C) of the ground-referenced current (Im) with high accuracy.

The convergence value estimating step may calculate the convergence value (C) of the ground-referenced current (Im) using the above equation (16). In the equation, $Im_1$, $Im_2$ and $Im_3$ are measurements of the ground-referenced current (Im) detected respectively at the detection times $t_1$, $t_2$ and $t_3$, and as to the detection times $t_1$ to $t_3$, the time interval between the detection times adjacent to each other is a fixed value ($\Delta t$), and $t_1$ is the earliest and $t_3$ is the latest. As a result, it is possible to estimate (calculate) the convergence value (C) of the ground-referenced current (Im) with high accuracy and simplify the estimation process (calculation process).

The present invention is not particularly limited to the embodiments described above, and various modifications are possible without departing from the essence and gist of the present invention.

What is claimed is:

1. A motor driving device for driving a plurality of motors, comprising:
   a rectifier circuit configured to rectify an AC voltage supplied from an AC power supply via a first switch to thereby obtain a DC voltage;
   a capacitor configured to smooth the DC voltage obtained by the rectifier circuit;
   a plurality of inverter units each including upper arm semiconductor switching elements configured to connect a positive-side terminal of the capacitor with motor coils of a corresponding one of the motors, and lower arm semiconductor switching elements configured to connect a negative-side terminal of the capacitor with the motor coils, the inverter units being configured to drive the motors by converting a capacitor voltage across the capacitor into an AC voltage by switching operation of the upper arm semiconductor switching elements and the lower arm semiconductor switching elements;
   a second switch configured to connect one terminal of the positive-side terminal and the negative-side terminal of the capacitor to ground;
   a first detector configured to detect a ground-referenced current flowing between the one terminal of the capacitor and the ground, or a ground-referenced voltage between the one terminal of the capacitor and the ground;
   a second detector configured to detect the capacitor voltage across the capacitor;
   a switch control unit configured to establish a measurement state for enabling measurement of an insulation resistance of a measurement target motor of the motors by turning off the upper arm semiconductor switching elements and the lower arm semiconductor switching elements of all the inverter units to thereby stop operation of every motor while turning off the first switch and turning on the second switch, then turning on a semiconductor switching element that is connected to another terminal of the capacitor, among the upper arm and lower arm semiconductor switching elements to which the motor coils of the measurement target motor are connected, and turning on a semiconductor switching element that is connected to the one terminal of the capacitor, among the upper arm and lower arm semiconductor switching elements to which the motor coils of each of the motors other than the measurement target motor are connected;
   a convergence value estimator configured to estimate a convergence value of the ground-referenced current or the ground-referenced voltage, based on multiple measurements of the ground-referenced current or the ground-referenced voltage, detected by the first detector at different detection times from one another in the measurement state; and
   an insulation resistance calculator configured to calculate the insulation resistance of the measurement target motor, based on the convergence value and the capacitor voltage,
   wherein:
   after estimating the convergence value, the convergence value estimator again estimates the convergence value, based on multiple measurements of the ground-referenced current or the ground-referenced voltage, detected by the first detector at multiple detection times, at least one of which is different from the multiple detection times for the previous estimation, continues to estimate the convergence value if a difference between the previous convergence value and the current convergence value is equal to or greater than a reference value, and terminates estimation of the convergence value if the difference is smaller than the reference value; and
   the insulation resistance calculator calculates the insulation resistance after termination of estimating of the convergence value.

2. The motor driving device according to claim 1, wherein the insulation resistance calculator calculates the insulation resistance using a last-estimated convergence value among the plurality of estimated convergence values.

3. The motor driving device according to claim 1, wherein the convergence value estimator calculates the convergence value of the ground-referenced voltage using the following equation (1):

$$C = \frac{Vm_3 - \alpha - C_0}{1 - \alpha\beta} + C_0, \quad (1)$$

$$\alpha = (Vm_1 - C_0)^{\frac{t_2-t_3}{t_2-t_1}} (Vm_2 - C_0)^{\frac{t_3-t_1}{t_2-t_1}}$$

$$\beta = \left( \frac{1}{Vm_1 - C_0} \times \frac{t_2 - t_3}{t_2 - t_1} + \frac{1}{Vm_2 - C_0} \times \frac{t_3 - t_1}{t_2 - t_1} \right)$$

where $t_1$, $t_2$ and $t_3$ are the detection times, $Vm_1$, $Vm_2$ and $Vm_3$ are measurements of the ground-referenced voltage detected respectively at the detection times $t_1$, $t_2$ and $t_3$, $C_0$ is a predetermined constant, and of the detection times $t_1$ to $t_3$, $t_1$ is earliest and $t_3$ is latest.

4. The motor driving device according to claim 1, wherein the convergence value estimator calculates the convergence value of the ground-referenced voltage using the following equation (2):

$$C = \frac{Vm_1 \times Vm_3 - Vm_2^2}{Vm_1 + Vm_3 - 2 \times Vm_2} \quad (2)$$

where $Vm_1$, $Vm_2$ and $Vm_3$ are measurements of the ground-referenced voltage detected respectively at the detection times $t_1$, $t_2$ and $t_3$, and as to the detection times $t_1$ to $t_3$, a time interval between the detection times adjacent to each other is a fixed value, and $t_1$ is earliest and $t_3$ is latest.

5. The motor driving device according to claim 1, wherein the convergence value estimator calculates the convergence value of the ground-referenced current using the following equation (3):

$$C = \frac{Im_3 - \alpha - C_0}{1 - \alpha\beta} + C_0 \quad (3)$$

$$\alpha = (Im_1 - C_0)^{\frac{t_2-t_3}{t_2-t_1}} (Im_2 - C_0)^{\frac{t_3-t_1}{t_2-t_1}}$$

$$\beta = \left( \frac{1}{Im_1 - C_0} \times \frac{t_2 - t_3}{t_2 - t_1} + \frac{1}{Im_2 - C_0} \times \frac{t_3 - t_1}{t_2 - t_1} \right)$$

where $t_1$, $t_2$ and $t_3$ are the detection times, $Im_1$, $Im_2$ and $Im_3$ are measurements of the ground-referenced current detected respectively at the detection times $t_1$, $t_2$ and $t_3$, $C_0$ is a predetermined constant, and of the detection times $t_1$ to $t_3$, $t_1$ is earliest and $t_3$ is latest.

6. The motor driving device according to claim 1, wherein the convergence value estimator calculates the convergence value of the ground-referenced current using the following equation (4):

$$C = \frac{Im_1 \times Im_3 - Im_2^2}{Im_1 + Im_3 - 2 \times Im_2} \quad (4)$$

where $Im_1$, $Im_2$ and $Im_3$ are measurements of the ground-referenced current detected respectively at the detection times $t_1$, $t_2$ and $t_3$, and as to the detection times $t_1$ to $t_3$, a time interval between the detection times adjacent to each other is a fixed value, and $t_1$ is earliest and $t_3$ is latest.

7. A motor driving device for driving a plurality of motors, comprising:
a rectifier circuit configured to rectify an AC voltage supplied from an AC power supply via a first switch to thereby obtain a DC voltage;
a capacitor configured to smooth the DC voltage obtained by the rectifier circuit;
a plurality of inverter units each including upper arm semiconductor switching elements configured to connect a positive-side terminal of the capacitor with motor coils of a corresponding one of the motors, and lower arm semiconductor switching elements configured to connect a negative-side terminal of the capacitor with the motor coils, the inverter units being configured to drive the motors by converting a capacitor voltage across the capacitor into an AC voltage by switching operation of the upper arm semiconductor switching elements and the lower arm semiconductor switching elements;

a second switch configured to connect one terminal of the positive-side terminal and the negative-side terminal of the capacitor to ground;
a first detector configured to detect a ground-referenced current flowing between the one terminal of the capacitor and the ground, or a ground-referenced voltage between the one terminal of the capacitor and the ground;
a second detector configured to detect the capacitor voltage across the capacitor;
a switch control unit configured to establish a measurement state for enabling measurement of an insulation resistance of a measurement target motor of the motors by turning off the upper arm semiconductor switching elements and the lower arm semiconductor switching elements of all the inverter units to thereby stop operation of every motor while turning off the first switch and turning on the second switch, then turning on a semiconductor switching element that is connected to another terminal of the capacitor, among the upper arm and lower arm semiconductor switching elements to which the motor coils of the measurement target motor are connected, and turning on a semiconductor switching element that is connected to the one terminal of the capacitor, among the upper arm and lower arm semiconductor switching elements to which the motor coils of each of the motors other than the measurement target motor are connected;
a convergence value estimator configured to estimate a convergence value of the ground-referenced current or the ground-referenced voltage, based on multiple measurements of the ground-referenced current or the ground-referenced voltage, detected by the first detector at different detection times from one another in the measurement state; and
an insulation resistance calculator configured to calculate the insulation resistance of the measurement target motor, based on the convergence value and the capacitor voltage,
wherein the convergence value estimator calculates the convergence value of the ground-referenced voltage using the following equation (1):

$$C = \frac{Vm_3 - \alpha - C_0}{1 - \alpha\beta} + C_0, \quad (1)$$

$$\alpha = (Vm_1 - C_0)^{\frac{t_2-t_3}{t_2-t_1}} (Vm_2 - C_0)^{\frac{t_3-t_1}{t_2-t_1}}$$

$$\beta = \left( \frac{1}{Vm_1 - C_0} \times \frac{t_2 - t_3}{t_2 - t_1} + \frac{1}{Vm_2 - C_0} \times \frac{t_3 - t_1}{t_2 - t_1} \right)$$

where $t_1$, $t_2$ and $t_3$ are the detection times, $Vm_1$, $Vm_2$ and $Vm_3$ are measurements of the ground-referenced voltage detected respectively at the detection times $t_1$, $t_2$ and $t_3$, $C_0$ is a predetermined constant, and of the detection times $t_1$ to $t_3$, $t_1$ is earliest and $t_3$ is latest.

8. A motor driving device for driving a plurality of motors, comprising:
a rectifier circuit configured to rectify an AC voltage supplied from an AC power supply via a first switch to thereby obtain a DC voltage;
a capacitor configured to smooth the DC voltage obtained by the rectifier circuit;
a plurality of inverter units each including upper arm semiconductor switching elements configured to connect a positive-side terminal of the capacitor with motor coils of a corresponding one of the motors, and lower arm semiconductor switching elements configured to connect a negative-side terminal of the capacitor with the motor coils, the inverter units being configured to drive the motors by converting a capacitor voltage across the capacitor into an AC voltage by switching operation of the upper arm semiconductor switching elements and the lower arm semiconductor switching elements;

a second switch configured to connect one terminal of the positive-side terminal and the negative-side terminal of the capacitor to ground;

a first detector configured to detect a ground-referenced current flowing between the one terminal of the capacitor and the ground, or a ground-referenced voltage between the one terminal of the capacitor and the ground;

a second detector configured to detect the capacitor voltage across the capacitor;

a switch control unit configured to establish a measurement state for enabling measurement of an insulation resistance of a measurement target motor of the motors by turning off the upper arm semiconductor switching elements and the lower arm semiconductor switching elements of all the inverter units to thereby stop operation of every motor while turning off the first switch and turning on the second switch, then turning on a semiconductor switching element that is connected to another terminal of the capacitor, among the upper arm and lower arm semiconductor switching elements to which the motor coils of the measurement target motor are connected, and turning on a semiconductor switching element that is connected to the one terminal of the capacitor, among the upper arm and lower arm semiconductor switching elements to which the motor coils of each of the motors other than the measurement target motor are connected;

a convergence value estimator configured to estimate a convergence value of the ground-referenced current or the ground-referenced voltage, based on multiple measurements of the ground-referenced current or the ground-referenced voltage, detected by the first detector at different detection times from one another in the measurement state; and an insulation resistance calculator configured to calculate the insulation resistance of the measurement target motor, based on the convergence value and the capacitor voltage, wherein the convergence value estimator calculates the convergence value of the ground-referenced current using the following equation (3):

$$C = \frac{Im_3 - \alpha - C_0}{1 - \alpha\beta} + C_0 \qquad (3)$$

$$\alpha = (Im_1 - C_0)^{\frac{t_2-t_3}{t_2-t_1}} (Im_2 - C_0)^{\frac{t_3-t_1}{t_2-t_1}}$$

$$\beta = \left( \frac{1}{Im_1 - C_0} \times \frac{t_2 - t_3}{t_2 - t_1} + \frac{1}{Im_2 - C_0} \times \frac{t_3 - t_1}{t_2 - t_1} \right)$$

where $t_1$, $t_2$ and $t_3$ are the detection times, $Im_1$, $Im_2$ and $Im_3$ are measurements of the ground-referenced current detected respectively at the detection times $t_1$, $t_2$ and $t_3$, $C_0$ is a predetermined constant, and of the detection times $t_1$ to $t_3$, $t_1$ is earliest and $t_3$ is latest.

* * * * *